(12) United States Patent
Perez Garraleta

(10) Patent No.: US 7,890,304 B2
(45) Date of Patent: Feb. 15, 2011

(54) METHOD AND SYSTEM FOR DESIGNING SMOOTH SURFACES FOR VEHICLE PARTS

(75) Inventor: Juan Ramón Perez Garraleta, Madrid (ES)

(73) Assignee: Airbus España, S.L., Madrid (ES)

( * ) Notice: Subject to any disclaimer, the term of this patent is extended or adjusted under 35 U.S.C. 154(b) by 1127 days.

(21) Appl. No.: 11/600,287

(22) Filed: Nov. 15, 2006

(65) Prior Publication Data

US 2008/0082192 A1    Apr. 3, 2008

(30) Foreign Application Priority Data

Sep. 29, 2006    (WO) ................ PCT/ES2006/070142

(51) Int. Cl.
*G06F 17/50* (2006.01)

(52) U.S. Cl. .......................... 703/1; 345/419
(58) Field of Classification Search ...................... 703/1
See application file for complete search history.

(56) References Cited

U.S. PATENT DOCUMENTS

| | | | | |
|---|---|---|---|---|
| 5,481,659 | A * | 1/1996 | Nosaka et al. | 345/423 |
| 5,615,319 | A * | 3/1997 | Metzger et al. | 345/427 |
| 6,256,038 | B1 * | 7/2001 | Krishnamurthy | 345/419 |
| 6,587,747 | B2 * | 7/2003 | Hirai et al. | 700/189 |
| 7,406,403 | B2 * | 7/2008 | Fox et al. | 703/1 |
| 2005/0086032 | A1 * | 4/2005 | Benitez et al. | 703/1 |

OTHER PUBLICATIONS

Bendi et al, "Surface Lofting and Smoothing with Skeletal-Lines", Computer Aided Geometric Design 6, pp. 87-96, 1989.*
Park, H., "An Approximate Lofting Approach for B-Spline Surface Fitting to Functional Surfaces", Int J Adv Manuf Technology (2001) 18:474-482.*
Lin et al, "A Surface-Lofting Approach for Smooth-Surface Reconstruction from 3D Measurement Data", Computers in Industry 34 (1997), pp. 73-85.*
Bentamy et al, "Cross-Sectional Design with Curvature Constraints", Computer Aided Design, vol. 37, Issue 14, Dec. 2005, pp. 1499-1508.*
Perrier, P., "Multi-Disciplinary Constraints in Aerodynamic Design", ADP010507, Jun. 2000.*

* cited by examiner

*Primary Examiner*—Mary C Jacob
(74) *Attorney, Agent, or Firm*—Ladas & Parry LLP

(57) ABSTRACT

A method and system for designing a smooth surface for a vehicle part, such as the hull of an aircraft, covering an area of the body of the vehicle part organized around an axis X. The method includes providing data indicating a profile, area, and position of a plurality of sectors perpendicular to axis X of the smooth surface, generating a first surface from the data by using a NURBS mathematical methodology, modifying N1 equidistant profiles (Py) of the surface until their area (APy) is consistent with the area determined by the area curve resulting from the data of the first step, and generating a second surface from the profiles (Py) and validating that the second surface adjusts to the area curve by using N2 equidistant profiles of the surface, where N2>N1.

6 Claims, 4 Drawing Sheets

METHOD AND SYSTEM FOR DESIGNING SMOOTH SURFACES FOR VEHICLE PARTS

FIELD OF THE INVENTION

The present invention relates to method and system for designing smooth surfaces for certain parts of aircrafts, ships, automobiles or other types of vehicles and specifically for surfaces of parts located on the main body of the vehicle.

BACKGROUND OF THE INVENTION

The use of parts located on the main body either in the fuselage in the case of aircrafts or in the body in the case of automotive vehicles is frequent in the design of aircrafts, ships, automobiles or other types of vehicles.

These parts, including most of the hulls used in the different types of vehicles mentioned are intended for purposes such as the following:
  Covering objects located in the outer part of the larger surface, minimizing the aerodynamic drag.
  Changing the aerodynamic features in certain areas.
  Improving the appearance of the product.

In the known art, the design of the surface of these parts is a very complex and expensive process entailing a significant part of the total manufacturing cost, especially if it must respond to aerodynamic conditionings.

The present invention is aimed at solving this drawback.

SUMMARY OF THE INVENTION

In a first aspect, this invention provides a computer-aided method for designing a smooth surface for a vehicle part covering an area of the surface of its body organized around an axis X, comprising the following steps:
  Providing data indicating the profile, area and the position of a plurality of sectors delimited between said smooth surface and said body by hypothetical planes perpendicular to axis X.
  Generating a surface from the data provided in the previous step by homogenizing the order and the nodal vector of each of the profiles of said sectors and applying homotheties to them with origin in their lower point so that their chords are equal.
  Modifying N1 equidistant profiles of the surface generated in the previous step by applying homotheties to them with origin in a point defining their position with respect to said body until their area corresponds to that of the profile located in the same position of axis X in a reference area curve made from the data provided in the first step such that it defines a smooth distribution of areas along axis X.
  Generating a surface from the resulting profiles of the previous step and validating that it adjusts to the reference area curve by using N2 equidistant profiles of said surface, where N2>N1. If this is not the case, the previous step is repeated increasing the value of N1 unless the latter prevents obtaining a smooth surface with the data provided in step a).

In a second step, the present invention provides a system for designing a smooth surface for a vehicle part covering an area of the surface of its body organized around an axis X, comprising a computer comprising at least one memory and a processor and an executable software residing in the memory of said computer which is able to carry out the following operations together with the computer:
  Storing data indicating the profile, the area and the position of a plurality of sectors delimited between said smooth surface and said body by hypothetical planes perpendicular to axis X in the memory of the computer.
  Generating a surface from said starting data by homogenizing the order and the nodal vector of each of the profiles of said sectors and applying homotheties to them with origin in their lower point so that the chords are equal.
  Modifying N1 equidistant profiles of the surface generated in the previous operation by applying homotheties to them with origin in a point defining their position with respect to said body until their area corresponds to that of the profile located in the same position of axis X in a reference area curve made from the starting data such that it defines a smooth distribution of areas along axis X.
  Generating a surface from the resulting profiles of the previous operation and validating that it adjusts to the reference area curve by using N2 equidistant profiles of said surface, where N2>N1. If this is not the case, the previous operation is performed again increasing the value of N1 unless the latter prevents obtaining a smooth surface with the starting data.

In a third aspect, the present invention provides a data signal in the form of a digital data flow for designing a smooth surface for a vehicle part covering an area of the surface of its body organized around an axis X in the following steps:
  Obtaining data indicating the profile, area and the position of a plurality of sectors delimited between said smooth surface and said body by hypothetical planes perpendicular to axis X.
  Generating a surface from said data by homogenizing the order and the nodal vector of each of the profiles of said sectors and applying homotheties to them with origin in their lower point so that their chords are equal.
  Modifying N1 equidistant profiles of the surface generated in the previous step by applying homotheties to them with origin in a point defining their position with respect to said body until their area corresponds to that of the profile located in the same position of axis X in a reference area curve made from the data provided in the first step such that it defines a smooth distribution of areas along axis X.
  Generating a surface from the resulting profiles of the previous step and validating that it adjusts to the reference area curve by using N2 equidistant profiles of said surface, where N2>N1. If this is not the case, the previous operation is performed again increasing the value of N1 unless the latter prevents obtaining a smooth surface with the data provided in the first step.

The present invention is considered to be particularly advantageous for designing the surfaces of aircraft hulls, without affecting its applicability to the design of the surface of other vehicle parts.

Other features and advantages of the present invention will be evident from the following detailed description of the illustrative embodiments of the object thereof together with the attached figures.

DETAILED DESCRIPTION OF THE INVENTION

Figure 1:
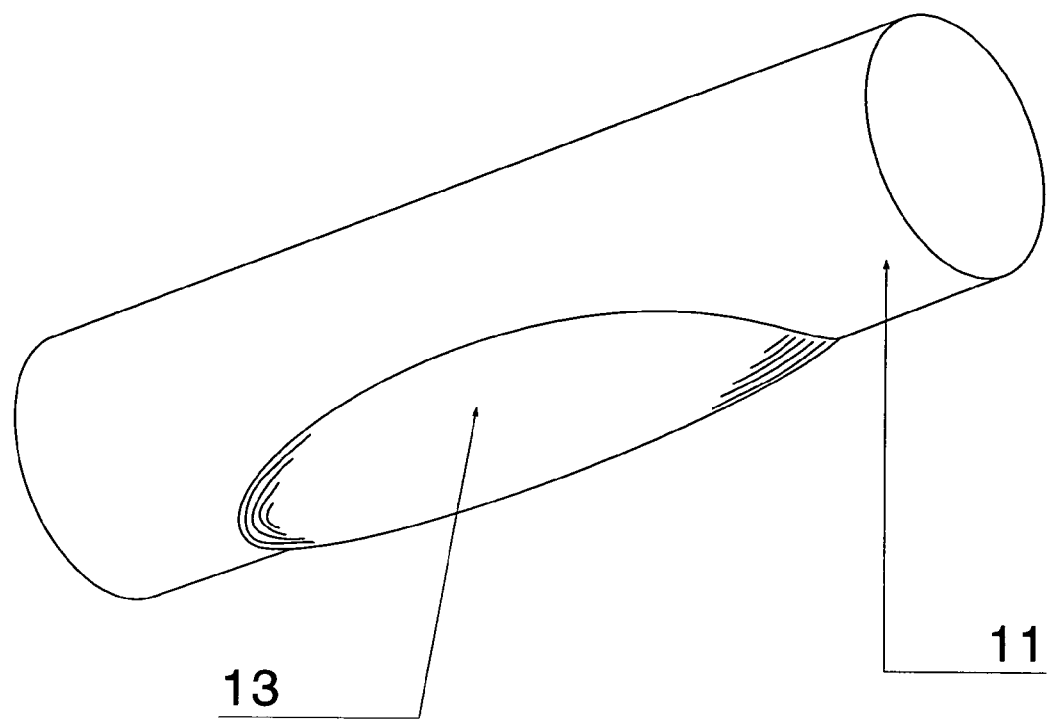
FIGS. 1, 2 and 3 show schematic perspective views of the smooth surface designed according to the present invention and of the body on which it is located in different orientations.
Figure 2:
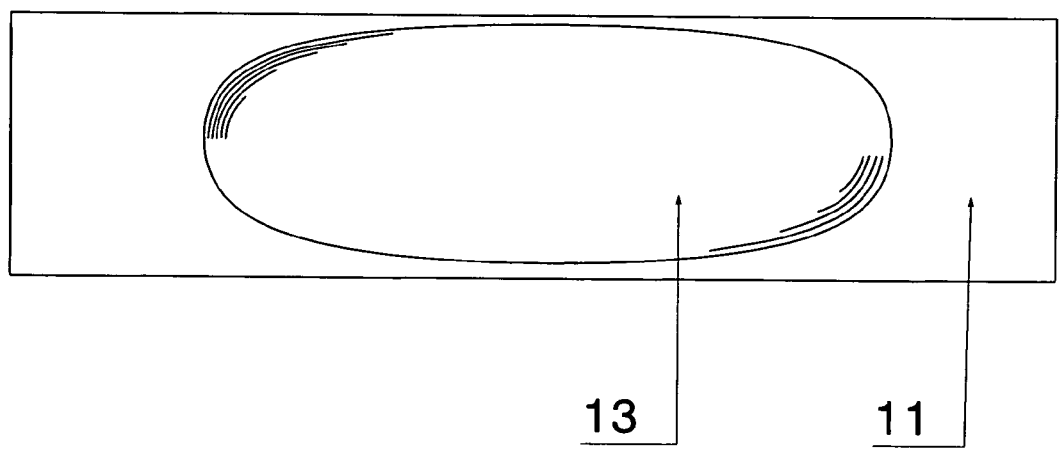
Figure 3:
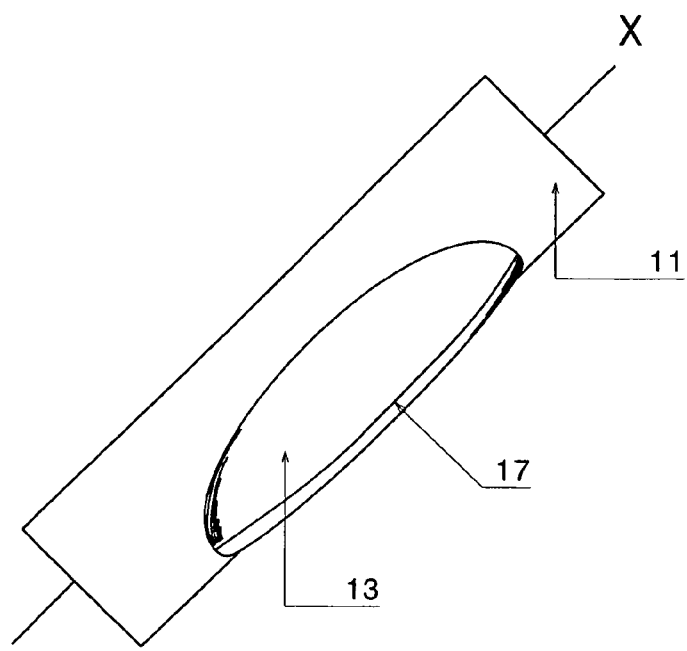

FIGS. 1, 2 and 3 show a vehicle part with a smooth surface 13 covering an area of its body 11 organized in relation to an axis X designed according to the method object of the present invention from the following starting data: a series of reference profiles along axis X, a guide curve and a distribution of areas, which are provided in a first step of the method.

Figure 4:
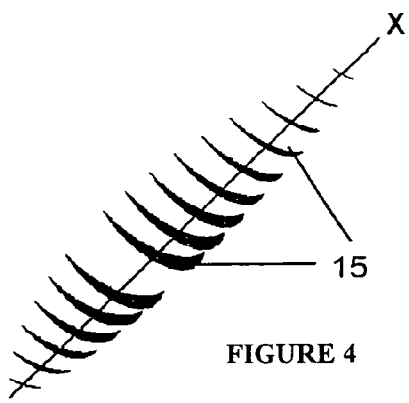
FIG. 4 shows a plurality of sectors delimited between the smooth surface designed according to the present invention and of the body on which it is located by planes perpendicular to axis X.

The reference profiles Pi provided as starting data are a set of flat curves defining the desired shape of a plurality of sectors 15 (see FIG. 4) delimited between said smooth surface 13 and the body 11 by hypothetical planes perpendicular to axis X.

Figure 5:
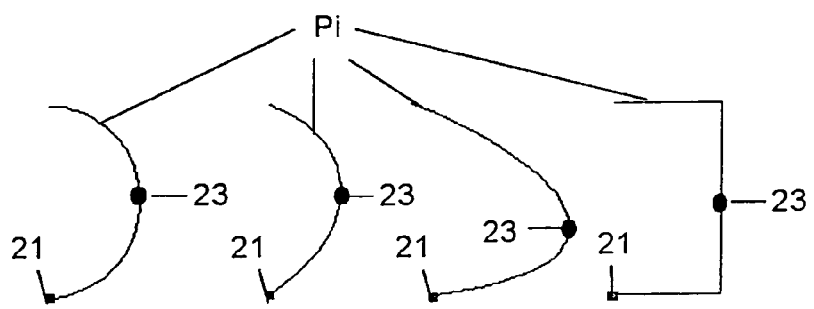
FIG. 5 shows several reference profiles of the smooth surface designed according to the present invention and FIG. 6 shows those same profiles with their respective chords.

By way of example, FIG. 5 shows four reference profiles Pi indicating the desired shape of four sectors 15 of the smooth surface 13 located in the position i in axis X.

In a preferred embodiment, those reference profiles Pi are provided in an IGES (Initial Graphics Exchange Specification) file. Their design can be done by means of any graphic design program which allows creating shapes with curvature continuity and the result of which can be saved in files with IGES format.

As will be seen below, in each of those reference profiles Pi it is possible to identify a lower point 21 of intersection with the body 11 and a central point 23 representing its position in relation to the body 11.

A guide curve 17 (see FIG. 3), which is the curve in which the central points 23 of the reference profiles Pi will be located, is also provided as starting data.

In a preferred embodiment, the guide curve 17 is provided as an IGES file.

The distribution of areas is a set of values of the areas of a plurality of sectors 15 (see FIG. 4) delimited between said smooth surface 13 and the body 11 by hypothetical planes perpendicular to axis X.

This distribution is an important factor to achieve the smooth surface 13 with good aerodynamic features. In this sense, the axis X around which the body 11 is organized coincides with the direction of the hypothetical flow of current falling therein.

In a preferred embodiment of the present invention, this distribution of areas is provided in the form of an ASCII file containing the value Aj of the area of the corresponding sector 15 for a set of coordinates j in axis X.

Figure 7:
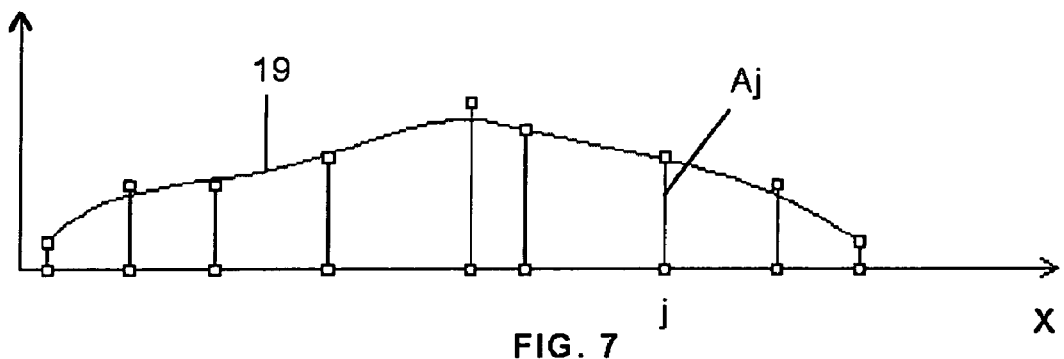
FIG. 7 shows the reference area curve of the smooth surface designed according to the present invention.

A reference area curve 19 (see FIG. 7) is obtained from this distribution of areas approximating the set of values Aj by means of a curve of order 3 generating a smooth distribution of areas, although it does not exactly represent the set of values Aj (8 in FIG. 7).

Together with the smoothness requirement, the distribution of areas is a fundamental factor in a surface intended to be used with aerodynamic purposes.

Figure 6:
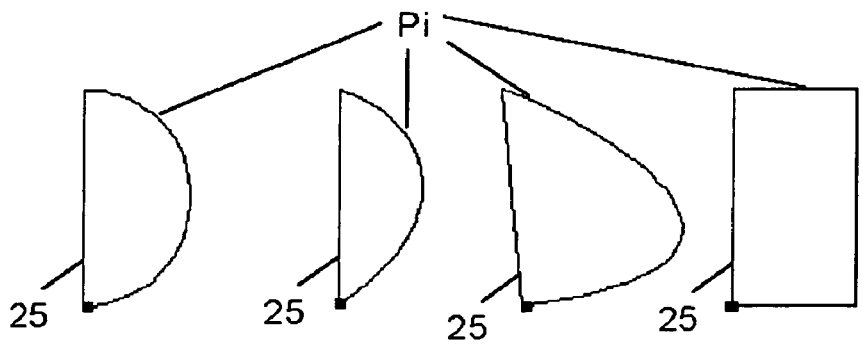

From the reference profiles Pi and the guide curve 17 and in a second step the design of the smooth surface 13, a surface is generated by modifying the order and nodal vector of each of the reference profiles Pi until reaching the values suitable for the order desired for the smooth surface 13, which is achieved by increasing the order and adding or eliminating nodes from each of the reference profiles Pi. Once the homogeneity in the order and nodal vector of all the profiles Pi has been achieved, a homothety with origin in the lower point 21 is applied to them so that the chords 25 (see FIG. 6) of all the profiles Pi are equal.

For the purposes of the invention, it must be understood that the generation of the mentioned surface is a process that is conceptually similar to classic process, known as skinning or lofting, for the creation of a surface from a series of flat curves using a mathematical methodology based on the so-called NURBS (Non Uniform Rational B-splines).

As it is an undetermined problem, because there are infinite surfaces which are supported on a series of flat curves, in the period of manual craftsmanship the problem was solved thanks to a master, a person with a lot of experience who adjusted a good surface by means of mechanical devices (French curves, etc).

Since the 80s, this problem could be solved using a mathematical methodology based on NURBS providing a unified formulation for any type of surface, including conical surfaces, the algorithms further being quick and stable from the computer point of view. The task of the old lofting expert is now translated into choosing the orders U and V of the surface and the so-called nodal vectors in a suitable manner. The orders are usually not greater than 5, but the possible nodal vectors are infinite, and it also very difficult to guess their influence on the result, therefore CAD systems are provided with help tool for that purpose. In any case the precise choice of relevant parameters optimizes the process as occurs in the method according to the present invention.

The surface obtained in this second step is a sort of "deformed cylinder" with the same diameter in all its sections.

In the third step of the design of the smooth surface 13, the surface obtained in the second step is modified so that it complies with the distribution of areas reflected in the reference area curve 19. This is carried out as follows.

Figure 8:
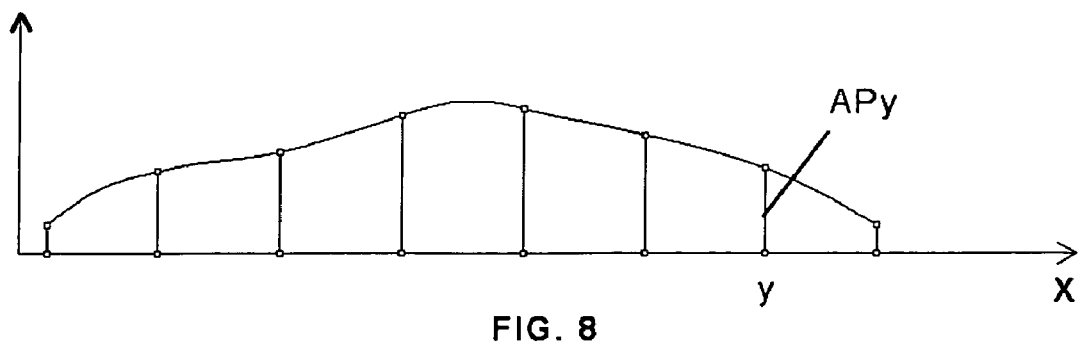
FIGS. 8 and 10 show the area curves of the surface generated during the design of the smooth surface according to the present invention obtained from a different number of sectors.

N1 equidistant sectors 15 of the surface resulting from the previous step are obtained, the profiles Py of which are modified by means of homotheties with origin in the central point of each profile Py (the one located in the guide curve 17) in an iterative process until achieving that their area APy (see FIG. 8) coincides with the corresponding area in the reference area curve 19 for the coordinate y. The number N1 of profiles Py (8 in FIG. 8) is determined by the desired order for the smooth surface 13 in direction X.

A new surface is generated from the profiles Py in a manner similar to the one mentioned previously.

In the fourth step of the design of the smooth surface 13, it is verified in detail whether the surface resulting from the previous step complies with the distribution of areas reflected in the reference area curve (19). This is carried out as follows.

N2 equidistant vectors of the surface resulting from the previous step are obtained, where N2 is greater than N1. The value of N2 is preset in advance and in a preferred embodiment is of the order of 50.

Figure 9:
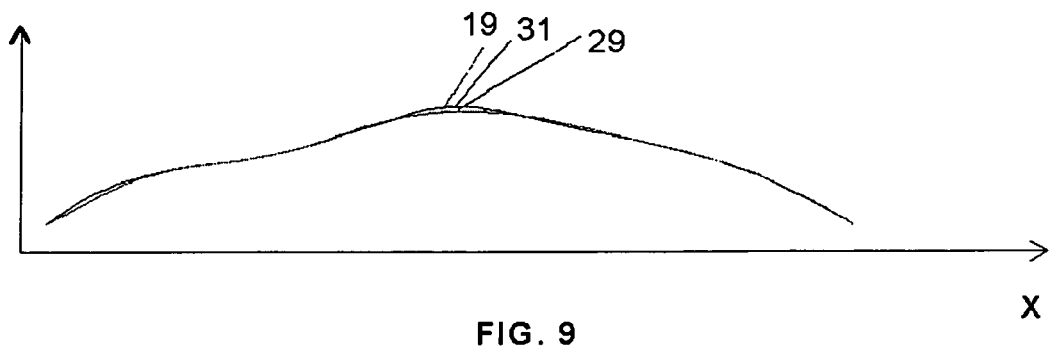
FIG. 9 shows the reference area curve of the smooth surface designed according to the present invention superimposed with an area curve of a surface generated during said design.

As shown in FIG. 9 in which the area curve 29 corresponding to said N2 vectors is superimposed with the reference area curve 19, the difference 31 between the sum of the areas of both curves is obtained.

If this difference 31 exceeds a preset value, the third step is repeated increasing the value of N1 unless its exceeds a preset value for obtaining a smooth surface, in which case the process is aborted because it is not possible to obtain a surface complying with the required conditions.

Figure 10:
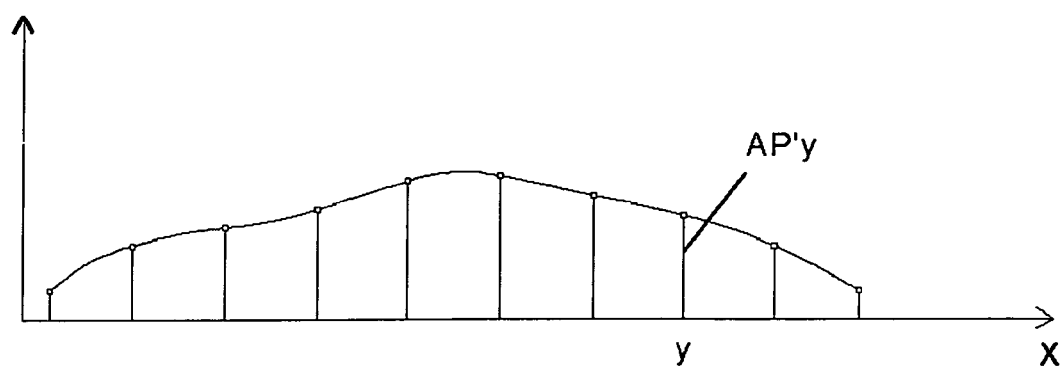

In the event of repeating the third step and as shown in FIG. 10, a new number N1 of equidistant sectors 15 of the surface resulting from the previous step is obtained, the profiles P'y of which (10 in FIG. 10) would be modified until achieving that their area AP'y coincides with the corresponding area in the reference area curve 19 for the coordinate y.

As the person skilled in the art will understand, the implementation of the embodiment of the present invention that has just been described and of other embodiments thereof can be carried out in an individual computer, in a computer network or in any computing device that can work with a CAD type program.

Any modifications comprised within the scope of the following claims can be introduced in the preferred embodiment which has been described.

The invention claimed is:

1. A computer-aided method for designing a smooth surface for a vehicle part covering an area of the surface of a body of said vehicle part organized around an axis X, comprising the following steps:
   a) providing data indicating a profile, area, and a position of a plurality of sectors delimited between said smooth surface and said body by hypothetical planes perpendicular to axis X;
   b) generating a surface from the data provided in step a) by homogenizing an order and a nodal vector of each of the profiles (Pi) of said sectors and applying homotheties to them with origin in their lower point so that chords of the profiles (Pi) are equal; and
   c) modifying N1 equidistant profiles (Py) of the surface generated in the previous step, where N1 is determined based on a desired order for the smooth surface in direction X, by applying homotheties to them with origin in a point defining their position with respect to the body until their area (APy) corresponds to that of a profile located in the same position of axis X in a reference area curve made from the data provided in step a) such that a smooth distribution of areas is defined along axis X;
   d) generating a surface from the profiles (Py) resulting from the previous step and validating that said surface adjusts to the reference area curve by using N2 equidistant profiles of said surface, where N2>N1; if this is not the case, repeating step c) increasing the value of N1 unless the latter prevents obtaining a smooth surface with the data provided in step a).

2. The computer-aided method for designing a smooth surface for a vehicle part according to claim 1, wherein said part is a hull of an aircraft.

3. A system for designing a smooth surface for a vehicle part covering an area of the surface of a body (11) of said vehicle part organized around an axis X, comprising a computer comprising at least one memory and a processor and executable software residing in the memory of said computer which is able to carry out the following operations together with the computer:
   a) storing data indicating a profile, an area, and a position of a plurality of sectors delimited between said smooth surface and said body by hypothetical planes perpendicular to axis X;
   b) generating a surface from said starting data by homogenizing an order and a nodal vector of each of the profiles (Pi) of said sectors and applying homotheties to them with origin in their lower point so that chords of the Profiles (Pi) are equal;
   c) modifying N1 equidistant profiles (Py) of the surface generated in the previous operation, where N1 is determined based on a desired order for the smooth surface in direction X, by applying homotheties to them with origin in a point defining their position with respect to the body until their area (APy) corresponds to that of a profile located in the same position of axis X in a reference area curve made from the starting data such that a smooth distribution of areas is defined along axis X; and
   d) generating a surface from the profiles (Py) resulting from the previous operation and validating that said surface adjusts to the reference area curve by using N2 equidistant profiles of said surface, where N2>N1; if this is not the case, performing the previous operation again increasing the value of N1 unless the latter prevents obtaining a smooth surface with the starting data.

4. A system for designing a smooth surface for a vehicle part according to claim 3, wherein said part is a hull of an aircraft.

5. A computer readable storage medium storing a program which, when executed by a processor, performs a method for designing a smooth surface for a vehicle part covering an area of the surface of a body of said vehicle part organized around an axis X, the method comprising:
   a) obtaining data indicating a profile, area and a position of a plurality of sectors delimited between said smooth surface and said body by hypothetical planes perpendicular to axis X;
   b) generating a surface from the data provided in step a) by homogenizing an order and a nodal vector of each of the profiles (Pi) of said sectors and applying homotheties to them with origin in their lower point so that chords of the profiles (Pi) are equal;
   c) modifying N1 equidistant profiles (Py) of the surface generated in the previous step, where N1 is determined based on a desired order for the smooth surface in direction X, by applying homotheties to them with origin in a point defining their position with respect to the body until their area (APy) corresponds to that of a profile located in the same position of axis X in a reference area curve made from the data provided in step a) such that a smooth distribution of areas is defined along axis X; and
   d) generating a surface from the profiles (Py) resulting from the previous step and validating that said surface adjusts to the reference area curve by using N2 equidistant profiles of said surface, where N2>N1; if this is not the case, repeating step c) increasing the value of N1 unless the latter prevents obtaining a smooth surface with the data provided step a).

6. A computer readable storage medium storing a program which, when executed by a processor, performs a method for designing a smooth surface for a vehicle part covering an area of the surface of a body of said vehicle part organized around an axis X according to claim 5, wherein said vehicle part is a hull of an aircraft.

* * * * *